(12) United States Patent
Okuda et al.

(10) Patent No.: US 8,176,871 B2
(45) Date of Patent: May 15, 2012

(54) SUBSTRATE PROCESSING APPARATUS

(75) Inventors: Kazuyuki Okuda, Toyama (JP);
Norikazu Mizuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 8 days.

(21) Appl. No.: 11/990,445

(22) PCT Filed: Mar. 28, 2007

(86) PCT No.: PCT/JP2007/056609
§ 371 (c)(1),
(2), (4) Date: Dec. 12, 2008

(87) PCT Pub. No.: WO2007/111348
PCT Pub. Date: Oct. 4, 2007

(65) Prior Publication Data
US 2009/0151632 A1 Jun. 18, 2009

(30) Foreign Application Priority Data

Mar. 28, 2006 (JP) ................................. 2006-088192

(51) Int. Cl.
| | |
|---|---|
| C23C 16/50 | (2006.01) |
| C23C 16/503 | (2006.01) |
| C23C 16/505 | (2006.01) |
| C23C 16/509 | (2006.01) |
| C23C 16/52 | (2006.01) |
| C23C 16/46 | (2006.01) |
| C23C 16/22 | (2006.01) |
| C23C 16/06 | (2006.01) |

(52) U.S. Cl. .............. 118/723 E; 118/723 ER; 118/663; 118/696; 118/697; 118/698; 118/699; 156/345.43; 156/345.44; 156/345.45; 427/532; 427/533; 427/569; 427/906

(58) Field of Classification Search ................... 427/532, 427/533, 569, 906; 118/723 E, 723 ER, 663, 118/696, 697, 698, 699; 156/345.43, 345.44, 156/345.45
See application file for complete search history.

(56) References Cited

U.S. PATENT DOCUMENTS
3,644,191 A * 2/1972 Matsushima ............ 204/298.06
(Continued)

FOREIGN PATENT DOCUMENTS
JP 63190173 A * 8/1988
(Continued)

OTHER PUBLICATIONS
JP 2008-507515 Office Action dated Sep. 21, 2010.
(Continued)

*Primary Examiner* — Rudy Zervigon
(74) *Attorney, Agent, or Firm* — Birch, Stewart, Kolasch & Birch, LLP

(57) ABSTRACT

Disclosed is a substrate processing apparatus, including: a processing space to provide a space in which a substrate is to be processed; a heating member to heat the processing space; a gas supply member to supply at least first and second processing gases to the processing space; an exhaust member to exhaust an atmosphere in the processing space; and a control member to control at least the gas supply member and the exhaust member such that supply and exhaust of the first and second processing gases are alternately repeated a plurality of times so that the first and second processing gases are not mixed with each other in the processing space when forming a desired film on the substrate, and both the first and second processing gases are supplied to the processing space when coating a surface of an inner wall of the processing space with a desired film.

7 Claims, 7 Drawing Sheets

U.S. PATENT DOCUMENTS

| Patent No. | Kind | | Date | Inventor | Class |
|---|---|---|---|---|---|
| 4,096,822 | A | * | 6/1978 | Yamawaki et al. | 118/729 |
| 4,401,689 | A | * | 8/1983 | Ban | 427/589 |
| 4,499,853 | A | * | 2/1985 | Miller | 118/725 |
| 4,612,207 | A | | 9/1986 | Jansen | 427/576 |
| 4,633,809 | A | * | 1/1987 | Hirose et al. | 118/719 |
| 4,657,616 | A | * | 4/1987 | Benzing et al. | 156/345.43 |
| 4,747,368 | A | * | 5/1988 | Brien et al. | 118/715 |
| 4,854,266 | A | * | 8/1989 | Simson et al. | 118/728 |
| 5,217,560 | A | * | 6/1993 | Kurono et al. | 156/345.43 |
| 5,279,670 | A | * | 1/1994 | Watanabe et al. | 118/725 |
| 5,383,984 | A | * | 1/1995 | Shimada et al. | 156/345.26 |
| 5,558,719 | A | * | 9/1996 | Tsuchida et al. | 118/723 E |
| 5,567,243 | A | * | 10/1996 | Foster et al. | 118/730 |
| 5,618,349 | A | * | 4/1997 | Yuuki | 118/715 |
| 5,647,912 | A | * | 7/1997 | Kaminishizono et al. | 118/719 |
| 5,739,069 | A | * | 4/1998 | Usui et al. | 438/710 |
| 5,770,098 | A | * | 6/1998 | Araki et al. | 216/67 |
| 5,811,022 | A | * | 9/1998 | Savas et al. | 216/68 |
| 5,925,188 | A | * | 7/1999 | Oh | 118/715 |
| 5,950,925 | A | * | 9/1999 | Fukunaga et al. | 239/132.3 |
| 6,135,053 | A | * | 10/2000 | Okamura | 118/723 E |
| 6,140,773 | A | * | 10/2000 | Anders et al. | 315/111.21 |
| 6,143,129 | A | * | 11/2000 | Savas et al. | 156/345.48 |
| 6,145,469 | A | * | 11/2000 | Teranishi et al. | 118/723 E |
| 6,146,461 | A | * | 11/2000 | Yang et al. | 118/715 |
| 6,305,314 | B1 | * | 10/2001 | Sneh et al. | 118/723 R |
| 6,388,381 | B2 | * | 5/2002 | Anders | 315/111.21 |
| 6,402,849 | B2 | * | 6/2002 | Kwag et al. | 118/715 |
| 6,446,572 | B1 | * | 9/2002 | Brcka | 118/723 ER |
| 6,500,500 | B1 | * | 12/2002 | Okamura | 427/569 |
| 6,540,838 | B2 | * | 4/2003 | Sneh et al. | 118/715 |
| 6,558,507 | B1 | * | 5/2003 | Teranishi et al. | 156/345.45 |
| 6,720,259 | B2 | * | 4/2004 | Londergan et al. | 438/680 |
| 7,354,631 | B2 | * | 4/2008 | Fuss et al. | 427/569 |
| 7,387,968 | B2 | * | 6/2008 | Joe | 438/716 |
| 7,464,717 | B2 | * | 12/2008 | Zhao et al. | 134/1.1 |
| 7,601,404 | B2 | * | 10/2009 | Yen et al. | 427/569 |
| 7,913,645 | B2 | * | 3/2011 | Sato et al. | 118/723 R |
| 2001/0025605 | A1 | * | 10/2001 | Nagakura | 118/715 |
| 2002/0033229 | A1 | * | 3/2002 | Lebouitz et al. | 156/345 |
| 2002/0124800 | A1 | * | 9/2002 | Moriyama | 118/715 |
| 2002/0153103 | A1 | * | 10/2002 | Madocks | 156/345.46 |
| 2003/0049372 | A1 | * | 3/2003 | Cook et al. | 427/248.1 |
| 2003/0164143 | A1 | * | 9/2003 | Toyoda et al. | 118/723 E |
| 2004/0025786 | A1 | * | 2/2004 | Kontani et al. | 118/715 |
| 2004/0107906 | A1 | * | 6/2004 | Collins et al. | 118/723.001 |
| 2004/0180553 | A1 | | 9/2004 | Park et al. | |
| 2004/0200417 | A1 | * | 10/2004 | Hanawa et al. | 118/723.001 |
| 2004/0231795 | A1 | * | 11/2004 | Rajagopalan et al. | 156/345.24 |
| 2005/0287775 | A1 | * | 12/2005 | Hasebe et al. | 438/503 |
| 2006/0124058 | A1 | | 6/2006 | Sakai et al. | |
| 2006/0180553 | A1 | | 8/2006 | Pfeiffer | |
| 2006/0260544 | A1 | * | 11/2006 | Toyoda et al. | 118/715 |
| 2007/0134415 | A1 | * | 6/2007 | Hwang et al. | 427/248.1 |
| 2007/0234961 | A1 | * | 10/2007 | Takahashi et al. | 118/723 R |
| 2008/0066681 | A1 | * | 3/2008 | Toyoda et al. | 118/723 R |
| 2008/0075888 | A1 | * | 3/2008 | Rajagopalan et al. | 427/579 |
| 2008/0121180 | A1 | * | 5/2008 | Kontani et al. | 118/723 R |
| 2008/0251014 | A1 | * | 10/2008 | Kontani et al. | 118/715 |
| 2008/0251015 | A1 | * | 10/2008 | Kontani et al. | 118/715 |
| 2008/0286980 | A1 | * | 11/2008 | Ishimaru | 438/716 |
| 2008/0292811 | A1 | * | 11/2008 | Choi et al. | 427/569 |
| 2009/0074984 | A1 | * | 3/2009 | Shimizu et al. | 427/569 |
| 2009/0151632 | A1 | * | 6/2009 | Okuda et al. | 118/666 |
| 2009/0255468 | A1 | * | 10/2009 | Yamamoto et al. | 118/723 E |
| 2010/0130009 | A1 | * | 5/2010 | Ishimaru | 438/680 |

FOREIGN PATENT DOCUMENTS

| | | | |
|---|---|---|---|
| JP | 09055372 A | * | 2/1997 |
| JP | 2004-282075 A | | 10/2004 |
| KR | 10-2004-0080755 A | | 9/2004 |
| KR | 10-2005-0053795 A | | 6/2005 |
| WO | WO-2004/044970 A1 | | 5/2004 |
| WO | WO-2005/098922 A1 | | 10/2005 |

OTHER PUBLICATIONS

Japanese Office Action issued on Jan. 18, 2011.

* cited by examiner

QUARTZ STRUCTURE

LP-CVD coating

ALD coating

SUBSTRATE PROCESSING APPARATUS

This Nonprovisional application claims priority under 35 U.S.C. §119(a) on Patent Application No(s). 2006/088192 filed in Japan on Mar. 28, 2006, the entire contents of which are hereby incorporated by reference.

The present invention relates to a substrate processing apparatus, and more particularly, to a film forming apparatus used when producing a semiconductor device such as a Si device.

In a conventional semiconductor device producing apparatus which forms a film by an ALD (Atomic Layer Deposition) method, a coating operation after maintenance such as $NF_3$ cleaning is carried out by film forming operation by the ALD method itself (see Patent Literature 1).

[Patent Literature 1] International Publication No. WO 2004/044970 Pamphlet

A standard RF power for forming a film on a wafer when $NH_3$ plasma is generated is 300 W.

In this state, however, there is a problem that wafer contamination caused by Na is a high value exceeding $1 \times 10^{11}$ atoms/$cm^2$.

It is a main object of the present invention to provide a substrate processing apparatus which forms a film by an ALD method and which can reduce contamination of a substrate by Na.

According to one aspect of the present invention, there is provided a substrate processing apparatus, comprising: a processing space, defined by a reaction tube made of quartz, to provide a space in which a substrate is to be processed;

a buffer space provided at an inner wall of the reaction tube and partitioned from the processing space;

an electrode provided inside the buffer space, the electrode being used when a first processing gas is plasma-excited, and high frequency voltage being to be applied to the electrode;

a heating member to heat the processing space;

a gas supply member to supply at least the first processing gas and a second processing gas to the processing space;

an exhaust member to exhaust an atmosphere in the processing space; and a control member to control at least the electrode, the heating member, the gas supply member and the exhaust member such that plasma is generated and the processing space is heated to a first temperature and supply and exhaust of the first processing gas and supply and exhaust of the second processing gas are alternately repeated a plurality of times so that the first and second processing gases are not mixed with each other in the processing space when forming a desired film on the substrate, and the processing space is heated to a second temperature that is higher than the first temperature without generating plasma and both the first and second processing gases are supplied to the processing space when coating a surface of an inner wall of the processing space with a desired film, wherein the first processing gas is to be supplied to the processing space through the buffer space, and the coating film is also to be formed on a surface of an inner wall of the buffer space.

According to another aspect of the present invention, there is provided a substrate processing apparatus, comprising:

a processing space to provide a space in which a substrate is to be processed;

a heating member to heat the processing space;

a gas supply member to supply at least first and second processing gases to the processing space;

an exhaust member to exhaust an atmosphere in the processing space; and a control member to control at least the gas supply member and the exhaust member such that supply and exhaust of the first and second processing gases are alternately repeated a plurality of times so that the first and second processing gases are not mixed with each other in the processing space when forming a desired film on the substrate, and both the first and second processing gases are supplied to the processing space when coating a surface of an inner wall of the processing space with a desired film.

According to another aspect of the present invention, there is provided a substrate processing apparatus, comprising:

a processing space to provide a space in which a substrate is to be processed;

a heating section to heat the processing space;

a first gas supply section to supply a first processing gas to the processing space;

a second gas supply section to supply a second processing gas to the processing space;

an exhaust section to exhaust an atmosphere in the processing space; and a control section to control at least the heating section, the first and second gas supply sections, and the exhaust section such that when the first or second processing gas is supplied from one of the first and second gas supply sections, an inert gas is supplied from the other gas supply section so that the first and second processing gases are not supplied together to the processing space when the substrate is accommodated in the processing space, and the control section controls such that both the first and second processing gases are supplied to the processing space from the first gas supply section and second gas supply section respectively when the substrate is not accommodated in the processing space.

Next, preferred embodiments of the present invention will be explained.

First, a substrate processing furnace suitably used in the preferred embodiments of the present invention will be explained.

Figure 1:
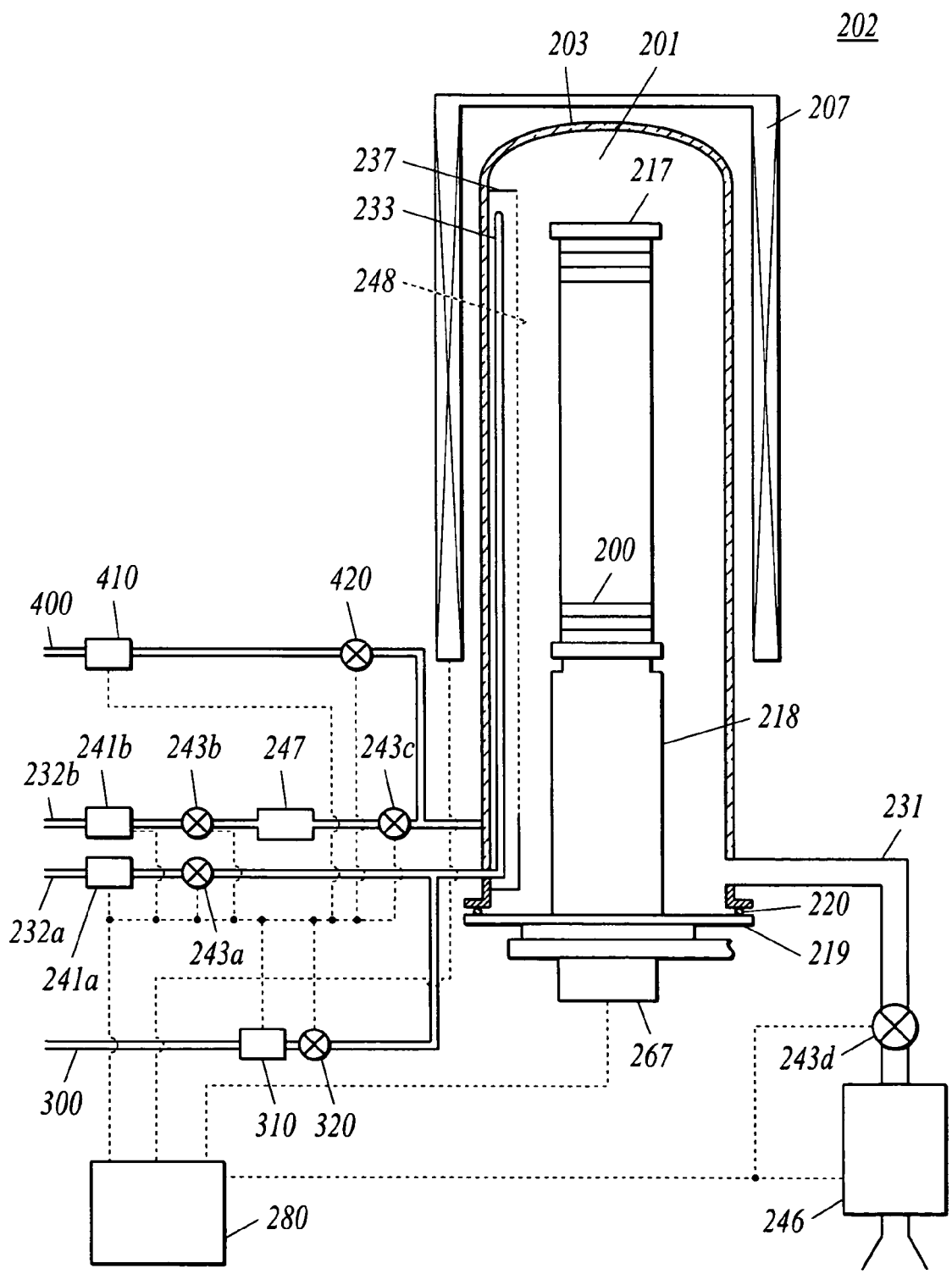
FIG. 1 is a schematic diagram showing a structure of a vertical type substrate processing furnace according to preferred embodiments of the present invention, and shows a vertical cross sectional view of a processing furnace portion.
Figure 2:
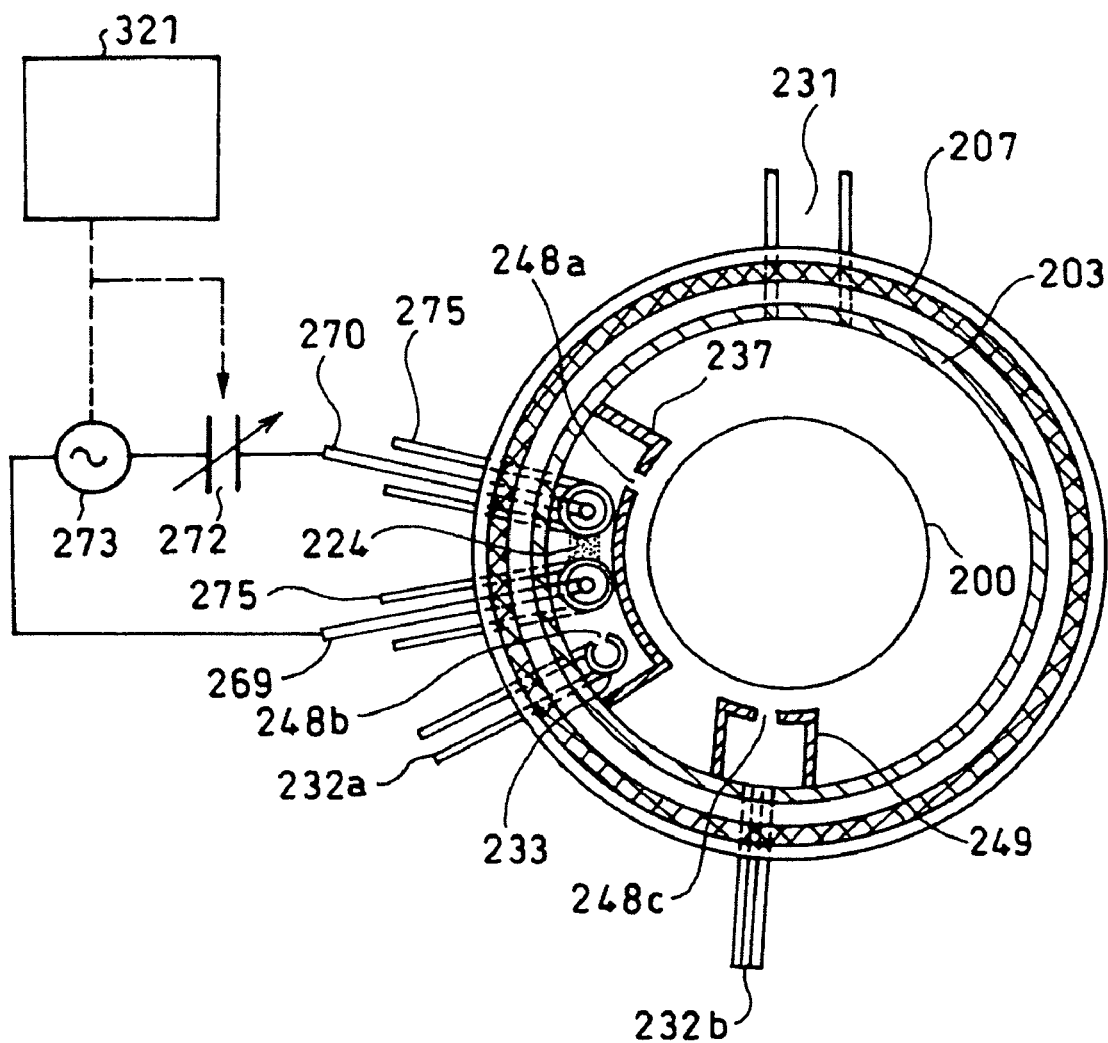
FIG. 2 is a schematic diagram showing the structure of the vertical type substrate processing furnace according to the preferred embodiments of the present invention, and shows a transverse sectional view of the processing furnace portion.

FIG. 1 is a schematic diagram showing a structure of a vertical type substrate processing furnace preferably used in the present embodiments, and shows a processing furnace 202 in vertical section. FIG. 2 is a schematic diagram showing a structure of the vertical type substrate processing furnace preferably used in the present embodiments, and shows the processing furnace 202 in transverse section.

A substrate processing apparatus used in the present embodiments includes a controller 208 which is a control section. The controller 208 controls operation of various parts which constitute the substrate processing apparatus and the substrate processing furnace.

A reaction tube 203 as a reaction container which processes the wafers 200 as substrates is provided inside a heater 207 which is a heating device (heating means). A lower end opening of the reaction tube 203 is air-tightly closed by a seal cap 219 as a lid through an O-ring 220 which is an air-tight member. A processing chamber 201 is formed by at least the reaction tube 203 and the seal cap 219. A boat 217 which is a substrate holding member (substrate holding means) stands on the seal cap 219 through a boat support stage 218. The boat support stage is a holding body which holds the boat 217. The boat 217 is inserted into the processing chamber 201. A plurality of wafers 200 which are to be subjected to batch process are stacked on the boat 217 in a horizontal attitude in multi-layers in the axial direction of the tube. The heater 207 heats the wafers 200 inserted into the processing chamber 201 to a predetermined temperature.

Two gas supply tubes 232a and 232b as supply paths are provided for supplying a plurality of kinds of (here, two kinds of) gases to the processing chamber 201. A reaction gas is supplied to the processing chamber 201 from the first gas supply tube 232a through a first mass flow controller 241a which is a flow rate control device (flow rate control means) and a first valve 243a which is an on-off valve, and through a later-described buffer chamber 237 formed in the reaction tube 203. A gas supply tube 300 is connected to the first gas supply tube 232a on a downstream side of the first valve 243a. The gas supply tube 300 is provided with a mass flow controller 310 which is a flow rate control device (flow rate control means) and a valve 320 which is an on-off valve. An inert gas such as $N_2$ is supplied to the processing chamber 201 from the gas supply tube 300 through the mass flow controller 310 and the valve 320, and through the later-described buffer chamber 237 formed in the reaction tube 203.

A reaction gas is supplied to the processing chamber 201 from the second gas supply tube 232b through a second mass flow controller 241b which is a flow rate control device (flow rate control means), a second valve 243b which is an on-off valve, a gas tank 247, a third valve 243c which is an on-off valve and a later-described gas supply section 249. A gas supply tube 400 is connected to the second gas supply tube 232b on a downstream side of the third valve 243c, and the gas supply tube 400 is provided with a mass flow controller 410 which is a flow rate control device (flow rate control means) and a valve 420 which is an on-off valve. An inert gas such as $N_2$ is supplied into the processing chamber 201 from the gas supply tube 400 through the mass flow controller 410, the valve 420 and the later-described gas supply section 249.

The processing chamber 201 is connected to a vacuum pump 246 which is an exhaust device (exhaust means) through a gas exhaust tube 231 for exhausting gas and a fourth valve 243d so that the processing chamber 201 can be evacuated. The fourth valve 243d is an on-off valve capable of evacuating the processing chamber 201 and stopping the evacuation by opening and closing the fourth valve 243d, and capable of adjusting the pressure in the processing chamber 201 by adjusting valve opening.

The buffer chamber 237 which is a gas diffusion space is provided in an arc space between the wafers 200 and an inner wall of the reaction tube 203 constituting the processing chamber 201 along a stacking direction of the wafers 200 at the inner wall of the reaction tube 203 from its lower portion to its upper portion. An end of the wall of the buffer chamber 237 adjacent to the wafers 200 is formed with first gas supply holes 248a which are supply holes for supplying gas. The first gas supply holes 248a are opened toward the center of the reaction tube 203. The first gas supply holes 248a have the same opening areas from the lower portion to the upper portion, and they have the same opening pitches.

A nozzle 233 is disposed on an end of the buffer chamber 237 opposite from the end where the first gas supply holes 248a are provided along the stacking direction of the wafers 200 from a lower portion to an upper portion of the reaction tube 203. The nozzle 233 is provided with second gas supply holes 248b which are supply holes for supplying a plurality of gases. When a pressure difference between the buffer chamber 237 and the processing chamber 201 is small, opening areas of the second gas supply holes 248b may be the same and the opening pitches may also be the same from upstream side to downstream side of gas, but when the pressure difference is great, the opening areas should be increased or the opening pitches should be reduced from the upstream side toward the downstream side.

In the present embodiments, the opening areas of the second gas supply holes 248b are gradually increased from the upstream side toward the downstream side. With this structure, gases having different flow velocities but having substantially the same flow rates flow into the buffer chamber 237 from the second gas supply holes 248b.

After the differences between particle velocities of gases blown out from the respective second gas supply holes 248b are moderated in the buffer chamber 237, the gases blow out from the first gas supply holes 248a into the processing chamber 201. Therefore, when the gases blown out from the respective second gas supply holes 248b blow out from the respective first gas supply holes 248a, the gases have equal flow rates and flow velocities.

A first rod-like electrode 269 which is a first electrode having a thin and long structure, and a second rod-like electrode 270 which is a second electrode are disposed in the buffer chamber 237 such that the electrodes are protected from their upper portions to lower portions by electrode protecting pipes 275 which are protecting pipes for protecting the electrodes. One of the first rod-like electrode 269 and the second rod-like electrode 270 is connected to a high frequency power supply 273 through a matching device 272, and the other one is connected to the ground which is a reference potential. As a result, plasma is generated in a plasma generating region 224 between the first rod-like electrode 269 and the second rod-like electrode 270.

The electrode protecting pipes 275 can be inserted into the buffer chamber 237 in a state where the first rod-like electrode 269 and the second rod-like electrode 270 are isolated from an atmosphere in the buffer chamber 237. If the atmosphere in the electrode protecting pipes 275 is the same as outside air (atmosphere), the first rod-like electrode 269 and the second rod-like electrode 270 inserted into the electrode protecting pipes 275 are oxidized by heat of a heater 207. An inert gas purge mechanism is provided for charging or purging an inert gas such as nitrogen into or from the electrode protecting pipes 275, suppressing oxygen density to a sufficient low level, and preventing the first rod-like electrode 269 or the second rod-like electrode 270 from being oxidized.

The gas supply section 249 is provided at an inner wall of the reaction tube 203 away from a position of the first gas supply holes 248a by about 120° along an inner periphery of the reaction tube 203. The gas supply section 249 is a supply section for sharing gas supply kinds with the buffer chamber 237 when supplying a plurality of kinds of gases alternately to the wafers 200 one kind by one kind in film formation by the ALD method.

The gas supply section 249 also includes third gas supply holes 248c like the buffer chamber 237 at locations adjacent to the wafers. The third gas supply holes 248c are supply holes for supplying gas at the same pitches. The second gas supply tube 232b is connected to a lower portion of the gas supply section 249.

When a pressure difference between the gas supply section 249 and the processing chamber 201 is small, opening areas of the third gas supply holes 248c may be the same and the opening pitches may be also the same from upstream side to downstream side of gas, but when the pressure difference is great, the opening areas should be increased or the opening pitches should be reduced from the upstream side toward the downstream side.

In the present embodiments, the opening areas of the third gas supply holes 248c are gradually increased from the upstream side toward the downstream side.

A boat 217 is provided at a central portion in the reaction tube 203. The plurality of wafers 200 are to be placed on the boat 217 in multi-layers at an equal distance from each other. The boat 217 can be loaded into and unloaded from the reaction tube 203 by a boat elevator mechanism (not shown). Further, to enhance the uniformity of the processing, there is provided a boat rotating mechanism 267 which is a rotating device (rotating means) for rotating the boat 217. By rotating the boat rotating mechanism 267, the boat 217 held by a quartz cap 218 is rotated.

A controller 280 which is control means is connected to the first and second mass flow controllers 241a and 241b, the mass flow controllers 310 and 410, the first to fourth valves 243a, 243b, 243c and 243d, the valves 320 and 420, the heater 207, the vacuum pump 246, the boat rotating mechanism 267, the boat elevator mechanism (not shown), the high frequency power supply 273 and the matching device 272. The controller 280 controls the adjustment of flow rates of the first and second mass flow controllers 241a and 241b and the mass flow controllers 310 and 410, controls opening and closing of the first to third valves 243a, 243b and 243c and the valves 320 and 420, controls opening and closing and the pressure adjustment of the fourth valve 243d, controls temperature adjustment of the heater 207, controls actuation and stop of the vacuum pump 246, controls adjustment of rotation speed of the boat rotating mechanism 267, controls the vertical movement of the boat elevator mechanism, controls electricity supply of the high frequency power supply 273, and controls impedance by the matching device 272.

Next, a film forming example using the ALD method will be explained giving an example of forming a SiN film using DCS and $NH_3$ gases as one of producing methods of a semiconductor device.

The ALD (Atomic Layer Deposition) method which is one of CVD (Chemical Vapor Deposition) methods is a technique in which two (or more) kinds of material gases used for forming films are alternately supplied onto substrates one by one under a given film forming condition (temperature, time and the like), the gases are adsorbed on an atom-layer basis, and films are formed utilizing surface reaction.

When a SiN (silicon nitride) film is to be formed for example, according to the ALD method, it is possible to form a high quality film at a low temperature in a range of 300 to 600° C. using DCS ($SiH_2Cl_2$, dichlorsilane) and $NH_3$ (ammonia) as chemical reaction to be utilized. A plurality of kinds of reaction gases are alternately supplied one by one. The film thickness is controlled based on the number of cycles of the supply of reaction gas. (When a film forming speed is 1 Å/cycle, in order to form a film of 20 Å, the film forming processing is carried out by 20 cycles.)

First, the boat 217 is charged with wafers 200 on which films are to be formed, and the boat 217 is loaded into the processing chamber 201. After the loading, the following three steps are executed sequentially.

(Step 1)

In step 1, $NH_3$ gas which needs plasma excitation and DCS gas which does not need plasma excitation flow in parallel. First, the first valve 243a provided in the first gas supply tube 232a and the fourth valve 243d provided in the gas exhaust tube 231 are both opened, $NH_3$ gas whose flow rate is adjusted by the first mass flow controller 243a from the first gas supply tube 232a blows into the buffer chamber 237 from the second gas supply holes 248b of the nozzle 233, high frequency electricity is applied between the first rod-like electrode 269 and the second rod-like electrode 270 from the high frequency power supply 273 through the matching device 272 to plasma-excite $NH_3$, the $NH_3$ is supplied into the processing chamber 201 as active species, and the $NH_3$ is exhausted from the gas exhaust tube 231. When the $NH_3$ gas flows by plasma excitation as the active species, the fourth valve 243d is appropriately adjusted to maintain a pressure in the processing chamber 201 at a desired pressure within a range of 10 to 100 Pa. The supply flow rate of $NH_3$ controlled by the first mass flow controller 241a is a desired flow rate within a range of 1 to 10 slm. Time during which the wafers 200 are exposed to the active species obtained by plasma-exciting $NH_3$ is desired time within a range of 2 to 120 seconds. The temperature of the heater 207 at that time is set to be a desired temperature within a range of 300 to 600° C. Since a reaction temperature of $NH_3$ is high, $NH_3$ does not react at the wafer temperature. Therefore, $NH_3$ flows as active species by plasma excitation. Thus, the wafer temperature is in the set low temperature range.

When $NH_3$ is plasma-excited and supplied as active species, the second valve 243b located upstream side of the second gas supply tube 232b is opened, the third valve 243c located downstream side is closed and DCS also flows. With this, DCS is stored in the gas tank 247 provided between the second and third valves 243b and 243c. At that time, gas flowing into the processing chamber 201 is active species obtained by plasma-exciting $NH_3$, and DCS does not exist. Therefore, $NH_3$ which is plasma-excited and becomes active species surface-reacts (chemisorption) with a surface portion such as a foundation film on the wafer 200 without causing vapor-phase reaction. In step 1, while $NH_3$ is plasma-excited and supplied as active species, the valve 420 is opened to supply an inert gas such as $N_2$ into the processing chamber 201 from the gas supply tube 400 so that $NH_3$ does not enter the gas supply section 249.

(Step 2)

In step 2, the first valve 243a of the first gas supply tube 232a and the valve 420 of the gas supply tube 400 are closed, the supply of $NH_3$ and the supply of inert gas are stopped, but supply to the gas tank 247 is continued. If a predetermined amount of DCS at a predetermined pressure is stored in the gas tank 247, the upstream second valve 243b is also closed to trap DCS in the gas tank 247. The fourth valve 243d of the gas exhaust tube 231 is left open, the gas in the processing chamber 201 is exhausted to 20 Pa or less by the vacuum pump 246, and remaining $NH_3$ is exhausted from the processing chamber 201. At that time, if the valve 420 and the valve 320 are opened and closed to repeat supply and supply-stop of an inert gas such as $N_2$ into the processing chamber 201 from the gas supply tube 400 and the gas supply tube 300, the effect for eliminating remaining $NH_3$ is enhanced. DCS is stored in the gas tank 247 such that the pressure therein becomes 20000 Pa or higher. Further, the apparatus is constituted such that a conductance between the gas tank 247 and the processing chamber 201 becomes $1.5\times10^{-3} m^3/s$ or higher. It is preferable that a capacity of the gas tank 247 is in a range of 100 to 300 cc if a capacity of the reaction tube 203 is 100 l (liters) when considering a ratio of a required capacity of the gas tank 247 to a capacity of the reaction tube 203, and the capacity ratio of the gas tank 247 is 1/1000 to 3/1000 times of the reaction chamber capacity.

(Step 3)

In step 3, after exhausting in the processing chamber 201, the fourth valve 243d of the gas exhaust tube 231 is closed to stop exhausting. The third valve 243c which is a downstream side of the second gas supply tube 232b is opened. With this, DCS stored in the gas tank 247 is supplied into the processing chamber 201 at a dash. At that time, since the fourth valve 243d of the gas exhaust tube 231 is closed, the pressure in the processing chamber 201 abruptly increases and reaches to about 931 Pa (7 Torr). Time during which DCS is supplied is set to two to four seconds, and time during which the wafers are exposed to the increased pressure atmosphere thereafter is set to two to four seconds, and the total time is set to six seconds. The wafer temperature at that time is maintained at a desired temperature within a range of 300 to 600° C. like the case when $NH_3$ is supplied. By supplying DCS, DCS and $NH_3$ which are chemisorbed on a surface of the wafer 200 surface-react (chemisorption) with each other, and a SiN film is formed on a wafer 200. In step 3, while DCS is supplied into the processing chamber 201, the valve 320 is opened to supply an inert gas such as $N_2$ into the processing chamber 201 from the gas supply tube 300 so that DCS does not enter the buffer chamber 237. After the film formation, the third valve 243c and the valve 320 are closed, the fourth valve 243d is opened to evacuate the processing chamber 201, and remaining DCS gas after contributing to the film formation is eliminated. At that time, if the valve 420 and the valve 320 are opened and closed to repeat supply of an inert gas such as $N_2$ into the processing chamber 201 from the gas supply tube 400 and the gas supply tube 300 and stop of the supply, the effect for eliminating, from the processing chamber 201, the remaining DCS gas after contributing to the film formation is further enhanced. The second valve 243b is opened to start the supply of DCS to the gas tank 247.

The above steps 1 to 3 are defined as one cycle. By repeating this cycle a plurality of times, a SiN film having predetermined thickness is formed on the wafer.

In the ALD apparatus, gas is chemisorbed on a surface portion of the wafer 200. The absorption amount of gas is proportional to gas pressure and gas exposing time. Therefore, in order to absorb a desired given amount of gas within a short time, it is necessary to increase the pressure of gas within a short time. In this embodiment, since the fourth valve 243d is closed and DCS stored in the gas tank 247 is instantaneously supplied, it is possible to abruptly increase the pressure of DCS in the processing chamber 201, and to absorb a desired constant amount of gas instantaneously.

In this embodiment, while DCS is stored in the gas tank 247, $NH_3$ gas is plasma-excited and supplied as active species and exhausted from the processing chamber 201. This step is necessary in the ALD method. Therefore, a special step for storing DCS is not required. Further, since DCS flows after exhausting in the processing chamber 201 to remove $NH_3$ gas, $NH_3$ gas and DCS do not react with each other on the way to the wafers 200. The supplied DCS can react effectively only with $NH_3$ absorbed in the wafers 200.

In this embodiment, the reaction tube 203, the buffer chamber 237 and the gas supply section 249 used in the substrate processing apparatus shown in FIGS. 1 and 2 are made of quartz.

As described above, SiN (silicon nitride) films are formed on wafers 200 by the ALD method. When coating a quartz member such as the reaction tube 203 by the ALD method, the coating is carried out under the condition that the wafers 200 are not placed on the boat 217, but gas is supplied as in the case of forming SiN (silicon nitride) films on the wafers 200.

Figure 6A:
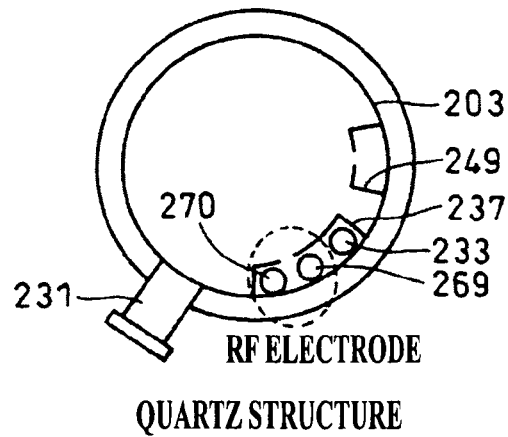
FIG. 6A is a schematic transverse sectional view for explaining a quartz structure of the vertical type substrate processing furnace according to the preferred embodiments of the present invention.
Figure 6B:
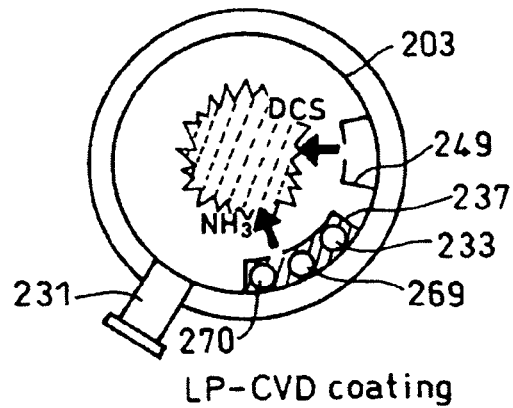
FIG. 6B is a schematic transverse sectional view for explaining a coating state by the LP-CVD method.

When coating a quartz member such as the reaction tube 203 by the CVD method, $NH_3$ is supplied from the buffer chamber 237 and DCS gas is supplied from the gas supply section 249 at the same time (see FIG. 6B). The coating is carried out under the condition that the wafers 200 are not placed on the boat 217.

The coating is carried out when a quartz member such as the reaction tube 203 is replaced or after cleaning processing using gas such as $NF_3$ is carried out. When the cleaning is carried out, cleaning gas such as $NF_3$ is supplied from the gas supply section 249 and an inert gas such as $N_2$ is supplied from the buffer chamber 237 at the same time. The inert gas is supplied from the buffer chamber 237 to prevent the cleaning gas from flowing into the buffer chamber 237. After the cleaning processing is executed, the coating is carried out for a quartz member such as the reaction tube 203 by the ALD method or the CVD method or by a combination thereof and then, the SiN film is formed by the ALD method.

In this embodiment, in the substrate processing apparatus which forms the SiN film by the ALD method, the following pretreatment and film forming condition are changed as follows:

(1) A surface of a quartz member such as the reaction tube 203 is coated by an LP-CVD (Low Pressure Chemical Vapor Deposition) method.

(2) When $NH_3$ plasma is generated at the time of ALD film forming processing, RF power is set to 100 or less, more preferably to 50 W or less.

With this, contamination of a wafer by Na could be reduced to about $5\times10^{10}$ atoms/$cm^2$ or less.

One example of the coating by the LP-CVD method is as follows:

The coating temperature is in a range of 600 to 760° C., the pressure is in a range of 10 to 100 Pa, the flow rate of $NH_3$ is in a range of 500 to 3,000 sccm, the flow rate of DCS is in a range of 50 to 300 sccm, and time is in a range of 1 to 3 hours. These values are set to and maintained at desired values within the above-described ranges.

One example of the ALD film forming is as follows:

A film forming temperature is in a range of 300 to 600° C. In $NH_3$ supply step, a pressure is in a range of 10 to 200 Pa, a flow rate of $NH_3$ is in a range of 1,000 to 10,000 sccm, and time is in a range of 2 to 120 seconds. In DCS supply step, a pressure is in a range of 700 to 3500 Pa, a flow rate of DCS is in a range of 500 to 2,000 sccm, and time is in a range of 1 to 20 seconds. These values are set to and maintained at desired values within the above-described ranges.

Figure 3:
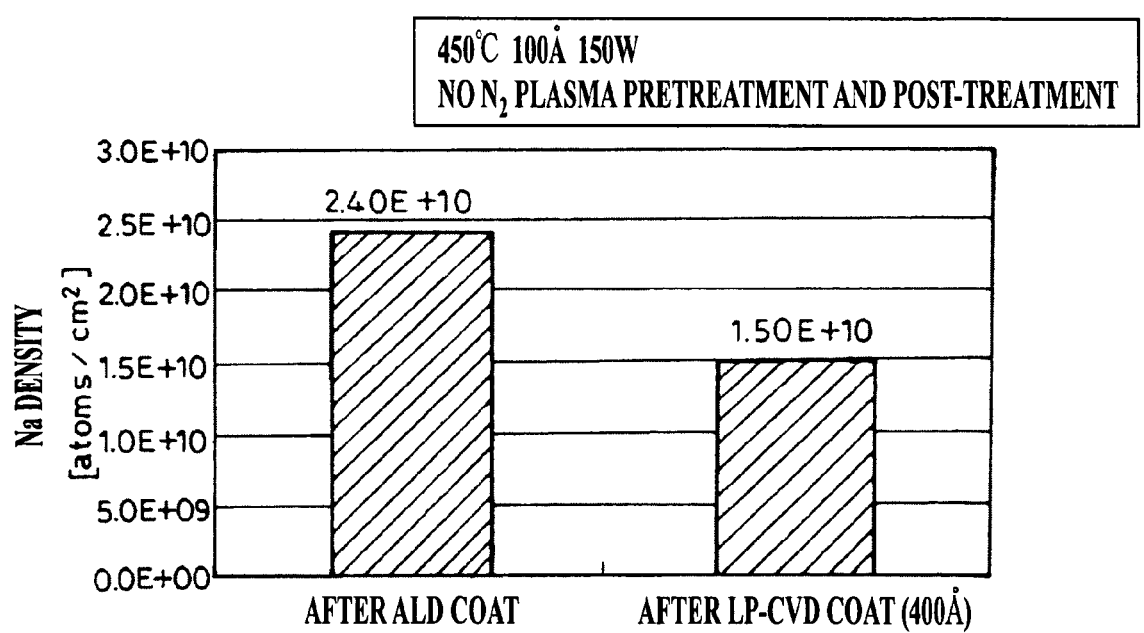
FIG. 3 is a diagram for explaining an effect of coating by an ALD method and an effect of coating by an LP-CVD method.

The Na contamination did not die down even if the apparatus and the quartz member were used for a long term. Therefore, it was contemplated that the cause of the Na contamination exists outside of a quartz member such as the reaction tube 203. Hence, the surface coating effect by the LP-CVD method was checked. As a result, there was obtained data from which it could be expected that Na contamination was slightly reduced by the coating by the LP-CVD method. The contamination reduction effect by the coating by the ALD method is small (see FIG. 3).

Thereafter, to obtain further improvement effect, various experiments and verifications were carried out. As a result, there was obtained data from which it could be expected that Na contamination could be reduced by reducing the RF power when forming films by the ALD method (see RF50W(1) in FIG. 4).

Figure 4:
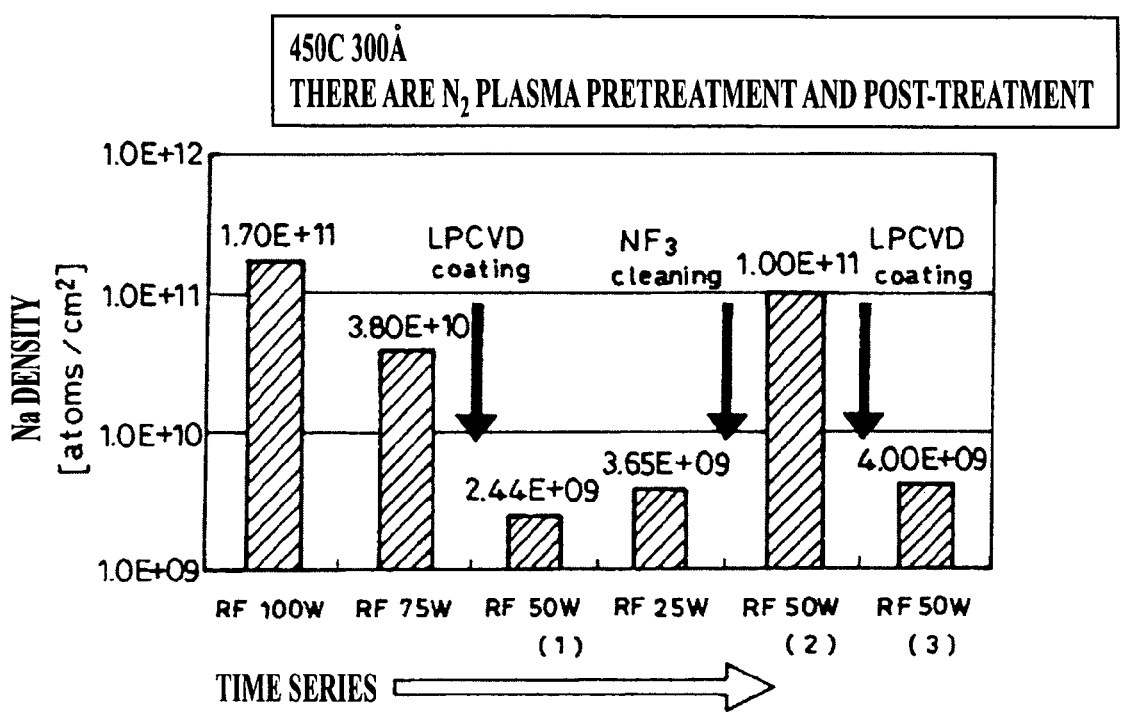
FIG. 4 is a diagram for explaining an effect of coating by the ALD method and an effect of coating by the LP-CVD method.

However, verification was again carried out after cleaning using $NF_3$, it was found that the Na contamination amount was not reduced only by reducing the RF power when forming films by the ALD method (see RF50W(2) in FIG. 4).

The data was analyzed in detail, and it was found that the Na contamination amount was reduced under the condition that the pretreatment by the coating of the LP-CVD method was carried out and RF power was reduced when forming films by the ALD method. As a result of retrial, it was confirmed that the combination of these two operations was effective (see RF50W(3) in FIG. 4).

As a result, if mechanism of mixing of Na contamination and mechanism for preventing the mixing by the above method are estimated, it can be contemplated as follows:

(1) Na is easily diffused into a quartz member, and Na is diffused and mixed from outside of the quartz member.

(2) Na in a coating film or the like exists in a form of ion or in a form similar to ion. It is contemplated that Na diffusion is facilitated by electric effect. Therefore, if RF power is reduced, Na diffusion can be reduced.

Figure 5:
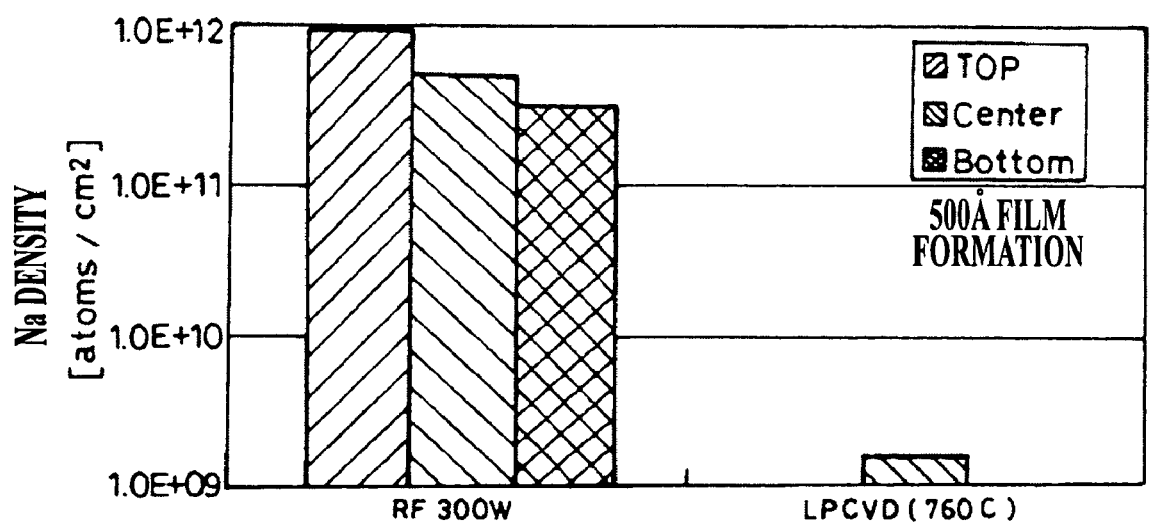
FIG. 5 is a diagram for explaining ability to prevent Na diffusion in the coating by the LP-CVD method.

(3) Since plasma is used in the coating processing by the ALD method, Na is attracted, and Na is prone to be taken into a film itself during film formation. It is contemplated that Na which is once taken into a film produces diffusion Path. On the other hand, since the coating processing by the LP-CVD method does not use plasma, Na is not attracted, Na is not included in a film itself and thus, Na diffusion preventing ability is high (see FIG. 5).

Figure 6C:
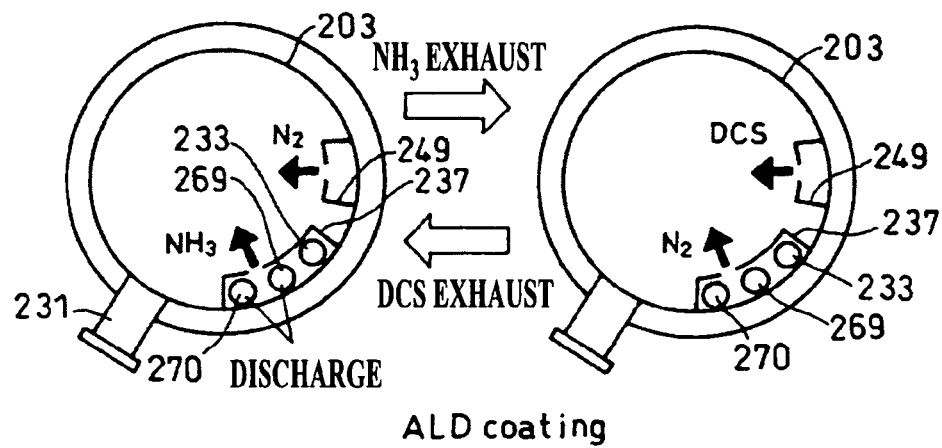
FIG. 6C is a schematic transverse sectional view for explaining a coating state by the ALD method.

(4) In the coating processing by the ALD method, it is contemplated that since gas is not mixed, quartz members existing around the RF electrodes 269 and 270 are not coated (see FIG. 6C). In the coating processing by LP-CVD method, on the other hand, it is contemplated that gas mixture of DCS ($SiH_2Cl_2$)+$NH_3$ reaches quartz members around the RF electrodes 269 and 270, and inside of the buffer chamber 237 is also coated and thus, the effect is especially enhanced (see FIG. 6B).

It is contemplated that the above-described action reduces the Na contamination amount.

As described above, according to the preferred embodiments of the present invention, in a semiconductor device producing apparatus which forms a SiN film by the ALD method, contamination of wafers by Na can be reduced.

Figure 7:
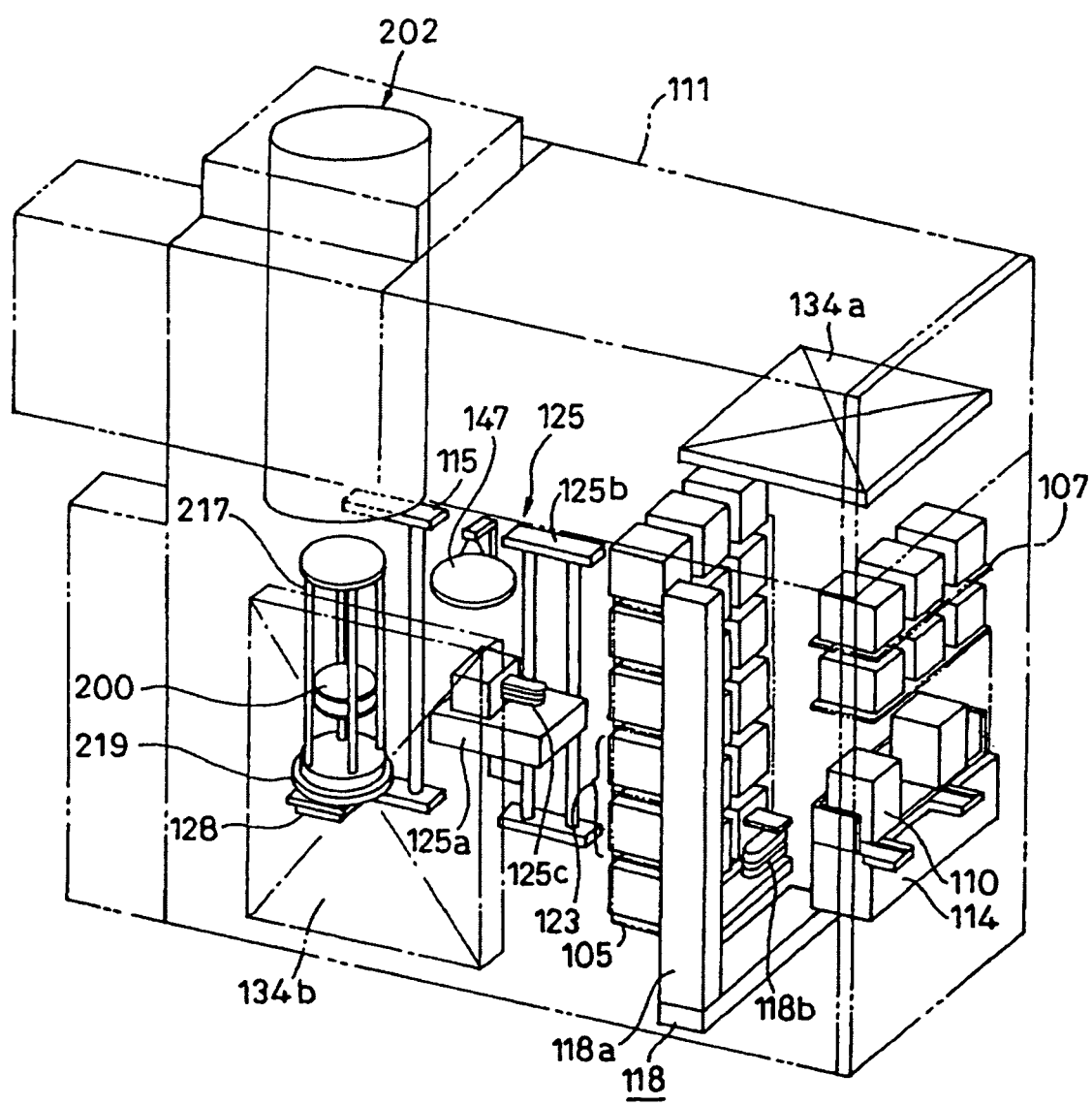
FIG. 7 is a schematic perspective view for explaining a substrate processing apparatus used for the preferred embodiments of the present invention.

In the best mode for carrying out the present invention, the substrate processing apparatus is constituted as a semiconductor device producing apparatus which carries out the processing steps in the producing method of a semiconductor device (IC) as one example. In the following explanation, a case in which a vertical type apparatus (simply, a processing apparatus, hereinafter) which subjects a substrate to oxidation processing, diffusion processing, CVD processing and the like is applied as a substrate processing apparatus will be described. FIG. 7 is a perspective view of a processing apparatus to which the present invention is applied.

As shown in FIG. 7, a processing apparatus 101 of the present invention uses cassettes 110 as wafer carriers which accommodate wafers (substrates) 200 made of silicon. The processing apparatus 101 includes a casing 111 having a front wall 111a. A front maintenance opening 103 as an opening is formed at a lower portion of the front wall so that maintenance can be carried out. A front maintenance door 104 is provided for opening and closing the front maintenance opening 103. A cassette carry in/out opening (a substrate container carry in/out opening) 112 is formed at the maintenance door 104 so that an inside and an outside of the casing 111 are in communication through the cassette carry in/out opening 112. The cassette carry in/out opening 112 is opened and closed by a front shutter (substrate container carry in/out opening open/close mechanism) 113. A cassette stage (a substrate container delivery stage) 114 is disposed at the cassette carry in/out opening 112 inside the casing 111. The cassette 110 is transferred onto the cassette stage 114 by a rail guided vehicle (not shown) and carried out from the cassette stage 114. The cassette 110 delivered by the rail guided vehicle is placed on the cassette stage 114 such that the wafers 200 in the cassette 110 are in their vertical attitudes and an opening of the cassette 110 for taking wafers in and out is directed upward. The cassette stage 114 is constituted such that it rotates the cassette 110 clockwisely in the vertical direction by 90° to rearward of the casing, the wafers 200 in the cassette 110 are in their horizontal attitudes, and the opening of the cassette 110 for taking wafers in and out is directed to rearward of the casing.

Cassette shelves (substrate container placing shelves) 105 are disposed substantially at a central portion in the casing 111 in its longitudinal direction, and the cassette shelves 105 store a plurality of cassettes 110 in a plurality of rows and a plurality of lines. The cassette shelves 105 are provided with transfer shelves 123 in which the cassettes 110 to be transferred by a wafer loading mechanism 125 are to be accommodated. Auxiliary cassette shelves 107 are provided above the cassette stage 114 to subsidiarily store the cassettes 110.

A cassette transfer device (a substrate container transfer device) 118 is provided between the cassette stage 114 and the cassette shelves 105. The cassette transfer device 118 includes a cassette elevator (a substrate container elevator mechanism) 118a capable of vertically moving while holding the cassette 110, and a cassette transfer mechanism (a substrate container transfer mechanism) 118b as a transfer mechanism. The cassette transfer device 118 transfers the cassette 110 between the cassette stage 114, the cassette shelves 105 and the auxiliary cassette shelves 107 by a continuous motion of the cassette elevator 118a and the cassette transfer mechanism 118b.

A wafer loading mechanism (a substrate transfer mechanism) 125 is provided behind the cassette shelves 105. The wafer loading mechanism 125 includes a wafer loading device (a substrate loading device) 125a which can rotate or straightly move the wafer 200 in the horizontal direction, and a wafer loading device elevator (a substrate loading device elevator mechanism) 125b which vertically moves the wafer loading device 125a. The wafer loading device elevator 125b is provided on a right end of the pressure-proof casing 111. Tweezers (a substrate holding body) 125c of the wafer loading device 125a as a placing portion of the wafers 200 charges a boat (a substrate holding tool) 217 with wafers 200 and discharges the wafers 200 from the boat 217 by continuous motion of the wafer loading device elevator 125b and the wafer loading device 125a.

A processing furnace 202 is provided at a rear and upper portion in the casing 111. A lower end of the processing furnace 202 is opened and closed by a furnace opening shutter (a furnace opening open/close mechanism) 147. A boat elevator (a substrate holding tool elevator mechanism) 115 is provided below the processing furnace 202 as an elevator mechanism for vertically moving the boat 217 to and from the processing furnace 202. A seal cap 219 as a lid is horizontally set up on an arm 128 as a connecting tool connected to an elevating stage of the boat elevator 115. The seal cap 219 vertically supports the boat 217, and can close a lower end of the processing furnace 202.

The boat 217 includes a plurality of holding members, and horizontally holds a plurality of wafers 200 (e.g., about 50 to 150 wafers) which are arranged in the vertical direction such that centers thereof are aligned with each other.

As shown in FIG. 7, a clean unit 134a is provided above the cassette shelves 105. The clean unit 134a includes a dustproof filter and a supply fan for supplying clean air which is a purified atmosphere so that the clean air flows into the casing 111.

As typically shown in FIG. 7, a clean unit 134b comprising a supply fan for supplying clean air and a dustproof filter is provided on a left side of the casing 111, i.e. on the opposite side of the wafer loading device elevator 125b and the boat elevator 115. Clean air belched out from the clean unit 134b flows through the wafer loading device 125a and the boat 217, and then is sucked in by an exhaust device (not shown), and is exhausted outside the casing 111.

Next, an operation of the substrate processing apparatus according to the preferred embodiment of the present invention will be explained.

As shown in FIG. 7, before the cassette 110 is supplied to the cassette stage 114, the cassette carry in/out opening 112 is opened by the front shutter 113. Then, the cassette 110 is transferred in from the cassette carry in/out opening 112, and is placed on the cassette stage 114 such that the wafers 200 are in their vertical attitudes and the opening of the cassette 110 for taking wafers in and out is directed upward. Then, the cassette 110 is rotated clockwisely in the vertical direction by 90° to rearward of the casing so that the wafers 200 in the cassette 110 are in their horizontal attitudes, and the opening of the cassette 110 for taking wafers in and out is directed to rearward of the casing.

Next, the cassette 110 is automatically transferred onto a designated shelf position of the cassette shelves 105 or the auxiliary cassette shelves 107 by the cassette transfer device 118, and the cassette 110 is temporarily stored. After that, the cassette 110 is transferred onto the transfer shelves 123 from the cassette shelves 105 or the auxiliary cassette shelves 107 by the cassette transfer device 118, or directly transferred onto the transfer shelves 123.

When the cassette 110 is transferred onto the transfer shelves 123, the wafers 200 are picked up from the cassette 110 through the opening by the tweezers 125c of the wafer loading device 125a, and the boat 217 located behind a loading chamber 124 is charged with the wafers 200. The wafer loading device 125a which delivered the wafers 200 to the boat 217 returns to the cassette 110, and charges the boat 217 with the next wafers 200.

When the boat 217 is charged with a predetermined number of wafers 200, a lower end of the processing furnace 202 which was closed by the furnace opening shutter 147 is opened by the furnace opening shutter 147. Then, the boat 217 which holds a group of wafers 200 is loaded into the processing furnace 202 by moving the seal cap 219 upward by the boat elevator 115.

After the loading, the wafers 200 are subjected to processing in the processing furnace 202.

After the processing, the wafers 200 and the cassette 110 are carried outside the casing 111 by reversing the above-described procedure.

As explained in the preferred embodiments of the present invention, according to the preferred embodiments of the present invention, there is provided a first substrate processing apparatus, comprising:

a processing space, defined by a reaction tube made of quartz, to provide a space in which a substrate is to be processed;

a buffer space provided at an inner wall of the reaction tube and partitioned from the processing space;

an electrode provided inside the buffer space, the electrode being used when a first processing gas is plasma-excited, and high frequency voltage being to be applied to the electrode;

a heating member to heat the processing space;

a gas supply member to supply at least the first processing gas and a second processing gas to the processing space;

an exhaust member to exhaust an atmosphere in the processing space; and a control member to control at least the electrode, the heating member, the gas supply member and the exhaust member such that plasma is generated and the processing space is heated to a first temperature and supply and exhaust of the first processing gas and supply and exhaust of the second processing gas are alternately repeated a plurality of times so that the first and second processing gases are not mixed with each other in the processing space when forming a desired film on the substrate, and the processing space is heated to a second temperature that is higher than the first temperature without generating plasma and both the first and second processing gases are supplied to the processing space when coating a surface of an inner wall of the processing space with a desired film, wherein the first processing gas is to be supplied to the processing space through the buffer space, and the coating film is also to be formed on a surface of an inner wall of the buffer space.

According to the preferred embodiments of the present invention, there is provided a second substrate processing apparatus, comprising:

a processing space to provide a space in which a substrate is to be processed;

a heating member to heat the processing space;

a gas supply member to supply at least first and second processing gases to the processing space;

an exhaust member to exhaust an atmosphere in the processing space; and a control member to control at least the gas supply member and the exhaust member such that supply and exhaust of the first and second processing gases are alternately repeated a plurality of times so that the first and second processing gases are not mixed with each other in the processing space when forming a desired film on the substrate, and both the first and second processing gases are supplied to the processing space when coating a surface of an inner wall of the processing space with a desired film.

Preferably, in the second substrate processing apparatus, there is provided a third substrate processing apparatus wherein the processing space is defined by a reaction tube made of quartz, an inner wall of the reaction tube is provided with a buffer space partitioned from the processing space, the first processing gas is to be supplied to the processing space through the buffer space, and the coating film is also to be formed on a surface of an inner wall of the buffer space.

More preferably, in the third substrate processing apparatus, there is provided a fourth substrate processing apparatus wherein an electrode is provided inside the buffer space, the electrode is used when the first processing gas is plasma-excited, and high frequency voltage is to be applied to the electrode, plasma is to be generated by the electrode when forming a desired film on the substrate, and plasma is not to be generated by the electrode when forming the coating film on the surface of the inner wall of the processing space.

Preferably, in the fourth substrate processing apparatus, there is provided a fifth substrate processing apparatus, wherein when forming a desired film on the substrate, the heating member heats the processing space to a first temperature, and when forming the coating film on the surface of the inner wall of the processing space, the heating member heats the processing space at a second temperature that is higher than the first temperature.

Most preferably, in the fourth substrate processing apparatus, there is provided a sixth substrate processing apparatus, wherein the electrode includes two electrodes having long and thin structures, and high frequency electricity of 50W is to be applied to the electrode when forming a desired film on the substrate.

Preferably, in the second substrate processing apparatus, there is provided a seventh substrate processing apparatus, wherein the gas supply member includes gas supply systems to independently supply the first and second processing gases, and when forming the desired film on the substrate and when forming the coating film on the surface of the inner wall of the processing space, the first and second processing gases are to be supplied to the processing space from the same gas supply systems.

Preferably, in the second substrate processing apparatus, there is provided an eighth substrate processing apparatus, wherein the coating of the desired film on the surface of the inner wall of the processing space is to be executed after a cleaning processing is executed by supplying a cleaning gas to the processing space, and before the desired film is formed on the substrate.

According to the other preferred embodiments of the present invention, there is provided a ninth substrate processing apparatus, comprising:

a processing space to provide a space in which a substrate is to be processed;

a heating section to heat the processing space;

a first gas supply section to supply a first processing gas to the processing space;

a second gas supply section to supply a second processing gas to the processing space;

an exhaust section to exhaust an atmosphere in the processing space; and a control section to control at least the heating section, the first and second gas supply sections, and the exhaust section such that when the first or second processing gas is supplied from one of the first and second gas supply sections, an inert gas is supplied from the other gas supply section so that the first and second processing gases are not supplied together to the processing space when the substrate is accommodated in the processing space, and the control section controls such that both the first and second processing gases are supplied to the processing space from the first gas supply section and second gas supply section respectively when the substrate is not accommodated in the processing space.

The entire disclosures of Japanese Patent Application No. 2006-088192 filed on Mar. 28, 2006 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, it is possible to reduce contamination of a substrate by Na. As a result, the present invention can especially suitably be utilized for a substrate processing apparatus which forms a film by an ALD method.

The invention claimed is:

1. A substrate processing apparatus, comprising: a processing space, defined by a reaction tube made of quartz, to provide a space in which a substrate is to be processed; a buffer space provided at an inner wall of the reaction tube and partitioned from the processing space; an electrode provided inside the buffer space, the electrode being used when a first processing gas is plasma-excited, and a high frequency voltage being applied to the electrode; a heating member to heat the processing space; a gas supply member to supply at least the first processing gas and a second processing gas to the processing space; an exhaust member to exhaust an atmosphere in the processing space; and a control member to control the electrode, the heating member, the gas supply member and the exhaust member, the control member including a film forming mode to form a desired film on the substrate and a coating mode to coat a desired film on a surface of an inner wall of the processing space, wherein a sequence of operations includes: in the film forming mode, the desired film is formed on the substrate in a state where the processing space loaded with the substrate is heated to a first temperature, by repeating the following a plurality of times in order: supplying a first processing gas to the processing space, removing the first processing gas remaining in the processing space, supplying the second processing gas to the processing space and removing the second processing gas remaining in the processing space in the coating mode, the desired film is coated on the surface of an inner wall of the processing space in a state where the processing space not loaded with the substrate is heated to a second temperature higher than the first temperature by supplying both the first processing gas and the second processing gas to the processing space at the same time, in the film forming mode, the first processing gas is excited by plasma and a high frequency voltage is applied to the electrode and in the coating mode, the first processing gas is not excited by plasma and a high frequency voltage is not applied to the electrode, the first processing gas is supplied to the processing space through the buffer space, and the coating is also formed on a surface of an inner wall of the bufferspace.

2. A substrate processing apparatus, comprising: a processing space to provide a space in which a substrate is to be processed; a heating member to heat the processing space; an exhaust member to exhaust an atmosphere in the processing space; and a control member to control the electrode, the gas supply member and the exhaust member, the control member including a film forming mode to form a desired film on the substrate and a coating mode to coat a desired film on a surface of an inner wall of the processing space, wherein a sequence of operations includes: in the film forming mode, the desired film is formed on the substrate in a state where the processing space is loaded with the substrate, by repeating the following a plurality of times in order: supplying a first processing gas to the processing space, removing the first processing gas remaining in the processing space, supplying the second processing gas to the processing space and removing the second processing gas remaining in the processing space, and in the coating mode, the desired film is coated on the surface of an inner wall of the processing space in a state where the processing space is not loaded with the substrate by supplying both the first processing gas and the second processing gas to the processing space at the same time.

3. The substrate processing apparatus according to claim 2, wherein the processing space is defined by a reaction tube made of quartz, an inner wall of the reaction tube is provided with a buffer space partitioned from the processing space, the first processing gas is supplied to the processing space through the buffer space, and the coating film is also formed on a surface of an inner wall of the buffer space.

4. The substrate processing apparatus according to claim 3, wherein an electrode is provided inside the buffer space, the electrode is used when the first processing gas is plasma-excited, and a high frequency voltage being applied to the electrode, plasma is generated by the electrode when forming a desired film on the substrate, and plasma is not generated by the electrode when forming the coating film on the surface of the inner wall of the processing space.

5. The substrate processing apparatus according to claim 4, wherein when forming a desired film on the substrate, the heating member heats the processing space to a first temperature, and when forming the coating on the surface of the inner wall of the processing space, the heating member heats the processing space at a second temperature that is higher than the first temperature.

6. The substrate processing apparatus according to claim 2, wherein the gas supply member includes gas supply systems to independently supply the first and second processing gases, and when forming the desired film on the substrate and when forming the coating film on the surface of the inner wall of the processing space, the first and second processing gases are to be supplied to the processing space from the same gas supply systems.

7. The substrate processing apparatus according to claim 2, wherein the coating of the desired film on the surface of the inner wall of the processing space is executed after a cleaning processing is executed by supplying a cleaning gas to the space, and before the desired film is formed on the substrate.

* * * * *